US006964919B2

(12) United States Patent
Kloster et al.

(10) Patent No.: US 6,964,919 B2
(45) Date of Patent: Nov. 15, 2005

(54) LOW-K DIELECTRIC FILM WITH GOOD MECHANICAL STRENGTH

(75) Inventors: Grant Kloster, Lake Oswego, OR (US); Lee Rockford, Portland, OR (US); Jihperng Leu, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 44 days.

(21) Appl. No.: 10/217,966

(22) Filed: Aug. 12, 2002

(65) Prior Publication Data

US 2004/0026783 A1 Feb. 12, 2004

(51) Int. Cl.[7] .................... H01L 21/4763; H01L 21/44
(52) U.S. Cl. .................... 438/626; 438/627; 438/637; 438/645; 438/648; 438/687
(58) Field of Search ................ 438/622–624, 438/626, 627, 631, 633, 637, 638, 643, 645, 438/648, 687; 257/637, 640–644, 751, 752, 257/758–763, 774

(56) References Cited

U.S. PATENT DOCUMENTS

| 6,472,306 B1 * | 10/2002 | Lee et al. ............ 438/623 |
| 6,806,161 B2 * | 10/2004 | Ko et al. ............. 438/409 |
| 2003/0224593 A1 * | 12/2003 | Wong ................. 438/629 |

* cited by examiner

Primary Examiner—Hung Vu
(74) Attorney, Agent, or Firm—George Chen

(57) ABSTRACT

The present invention discloses a method including providing a substrate; forming a dielectric over the substrate, the dielectric having a k value of about 2.5 or lower, the dielectric having a Young's modulus of elasticity of about 15 GigaPascals or higher; forming an opening in the dielectric; and forming a conductor in the opening.

The present invention further discloses a structure including a substrate; a dielectric located over the substrate, the dielectric having a k value of 2.5 or lower, the dielectric having a Young's modulus of elasticity of about 15 GigaPascals or higher; an opening located in the dielectric; and a conductor located in the opening.

11 Claims, 2 Drawing Sheets

LOW-K DIELECTRIC FILM WITH GOOD MECHANICAL STRENGTH

BACKGROUND OF THE INVENTION

1. Field of the Invention

The present invention relates to the field of semiconductor integrated circuit (IC) manufacturing, and more specifically, to a method of forming an electrically insulating material with a low dielectric constant and good mechanical strength and a structure including a dielectric having low dielectric constant and good mechanical strength.

2. Discussion of Related Art

In 1965, Gordon Moore first observed that the number of transistors per unit area on an IC chip doubled approximately every 18 months. Over the ensuing decades, the semiconductor industry has managed to adhere to the schedule projected by the so-called Moore's Law for improving the device density.

The transistors on the chip are usually fabricated in a substrate from a semiconductor material, such as Silicon, and an electrically insulating material, such as Silicon Oxide or Silicon Nitride. Subsequently, the transistors are wired with an electrically conducting material, such as Aluminum or Copper. The electrically conducting material may be stacked in multiple layers that are separated by the electrically insulating material.

Maintaining the schedule for each device generation or technology node has required continual enhancements to the processes of photolithography and etch to reduce the critical dimension (CD) that may be successfully patterned in the features across the chip. In addition, significant improvements had to be made to the processes of ion implantation, oxidation, and deposition to produce the desired doping levels and film thicknesses across the chip.

Photolithography was able to keep up with the reduction in CD needed for each device generation. However, improving the resolution that could be achieved often required sacrificing the depth of focus (DOF) that could be tolerated. As a result, the smaller DOF had to be countered by reducing the topography at the surface of the substrate in which the device was being formed. Planarization of the surface of the substrate became necessary to reduce topography for both the front-end and the back-end of semiconductor processing. Chemical-mechanical polish (CMP) is an enabling technology to planarize advanced devices.

In order to improve device density, both the transistor in the front-end of semiconductor processing and the wiring in the back-end of semiconductor processing have to be scaled down. The scaling of the transistor and the scaling of the wiring must be carefully balanced to prevent limitation of the switching performance. The switching performance of the transistor may be degraded by excessively large resistance-capacitance (RC) product delay in the wiring. Resistance in the wiring may be reduced by using an electrically conducting material with a lower resistivity. Capacitance in the wiring may be reduced by using an electrically insulating material with a lower dielectric constant (k).

However, an electrically insulating material with a low dielectric constant may not be strong enough to withstand CMP.

Thus, what is needed is a method of forming an electrically insulating material with a low dielectric constant and good mechanical strength and a structure including a dielectric having low dielectric constant and good mechanical strength.

BRIEF DESCRIPTION OF THE DRAWINGS

FIG. 1(g) is also an illustration of a cross-sectional view of a structure including a dielectric having a low dielectric constant and good mechanical strength.

DETAILED DESCRIPTION OF THE PRESENT INVENTION

In the following description, numerous details, such as specific materials, dimensions, and processes, are set forth in order to provide a thorough understanding of the present invention. However, one skilled in the art will realize that the invention may be practiced without these particular details. In other instances, well-known semiconductor equipment and processes have not been described in particular detail so as to avoid obscuring the present invention.

The present invention describes a method of using a chemical vapor deposition (CVD) process to form an electrically insulating material, or dielectric, with a low dielectric constant and good mechanical strength, as shown in FIGS. 1(a)–(g). In one embodiment, the CVD process forms Silicon Oxide with pores. In another embodiment, the CVD process forms Fluorine-doped Silicon Oxide with pores. In still another embodiment, the CVD process is plasma-enhanced CVD (PECVD). The present invention also describes a structure including a porous dielectric that has a low dielectric constant and good mechanical strength. In one embodiment, the porous dielectric is Silicon Oxide. In another embodiment, the porous dielectric is Fluorine-doped Silicon Oxide. Measurements of mechanical strength include Young's modulus of elasticity and shear strength.

Figure 1A:
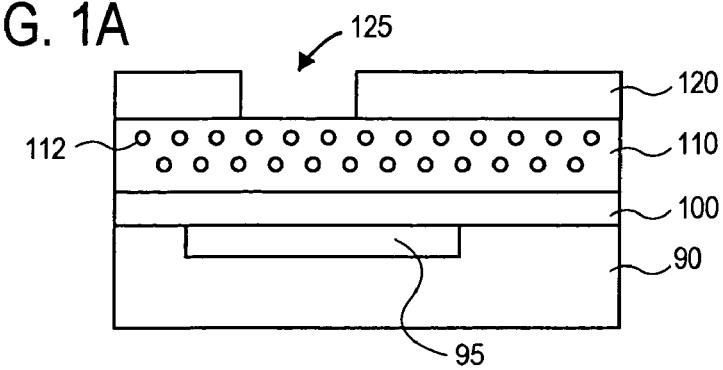
FIGS. 1(a)–(g) are illustrations of a cross-sectional view of an embodiment of a method of forming an electrically insulating material with a low dielectric constant and good mechanical strength according to the present invention.

As shown in an embodiment in FIG. 1(a), an underlying conductor 95, connected to a device, is formed in a dielectric material 90 that is part of a substrate. The dielectric material 90 may be covered with an etch stop layer 100. The etch stop layer 100 may have a thickness selected from a range of about 200–1,500 Angstroms.

The etch stop layer 100 must be thick enough to prevent breakthrough when an opening, such as a via opening 127, is formed later in an overlying dielectric, such as an interlayer dielectric (ILD) 110, as shown in an embodiment in FIG. 1(b). The formation of the via opening 127 may involve etch of the ILD 110, as well as precleans and postcleans associated with the etch.

The etch stop layer 100 usually has a k value that is higher than the k value for the ILD 110 so the thickness of the etch stop layer 100 should be minimized. Materials that may be used for the etch stop layer 100 include Silicon Nitride ($Si_3N_4$) which has a k value of about 6.5 and Silicon Carbide (SiC) which has a k value of about 4.5–5.5. The k value may be determined by measuring capacitance on a parallel-plate electrical structure.

The ILD 110 may be formed over the etch top layer 100. The ILD 110 may have a thickness selected from a range of about 0.1–2.0 microns (um). The k value of the ILD 110 should also be minimized. Otherwise, excessive intralayer and interlayer capacitance may contribute to cross-talk and increase the resistance-capacitance (RC) product delay of an inlaid interconnect 175 to be formed later, as shown in FIG. 1(g). An increase in RC product delay will degrade switching speed of the device in the substrate that is connected, through the underlying conductor 95, to the inlaid interconnect 175.

The k value of the ILD 110 depends on the device design rules. In general, the k value should be lower as inlaid interconnects 175 are located closer together in the same layer (horizontally) and in different layers (vertically). For device design rules down to about 250 nm, the ILD 110 may be formed from Silicon Oxide ($SiO_2$), having a k value of about 3.9–4.5. For device design rules of about 180 nm, the ILD 110 should have a k value of about 4.0 or lower. For device design rules of about 90 nm, the ILD 110 should have a k value of about 3.5 or lower. For device design rules of about 65 nm, the ILD 110 should have a k value of about 3.0 or lower. For device design rules of about 45 nm, the ILD 110 should have a k value of about 2.5 or lower.

A material is considered to be low-k if its k value is lower than the k value of $SiO_2$. Doping $SiO_2$ with Fluorine to form Fluorinated Silicate Glass (FSG or SiOF) reduces k value to about 3.5–4.0. Other low-k materials having even lower k value may be formed from certain organic materials or silicate materials. Low-k materials may also be formed from hybrids of organic and silicate materials, such as organosilicate glass (OSG) or carbon-doped oxide (CDO).

The ILD 110 may be formed in many ways, such as by using a CVD process. In one embodiment, the ILD 110 may be formed using a plasma-enhanced CVD (PECVD) process.

Increasing deposition rate may lower the k value of the bulk material forming the ILD 110 by about 0.3–0.6. A higher deposition rate of the ILD 110 may be achieved with PECVD by using one or more of the following conditions: low power, high pressure, and high gas flow rate. In a first embodiment, the pressure may be about 500–2,500 Watts. In a second embodiment, the pressure may be about 500–1,000 Pascals. In a third embodiment, the gas flow rate may be about 300–1,000 standard cubic feet per minute (scfm).

In another embodiment, the deposition rate for the ILD 110 may be increased by adding more Silicon atoms to the gas flow in the plasma, such as by using dimers for precursors. Precursors that may be used for formation of $SiO_2$ include dimers, such as $Si_2(OCH_2CH_3)_6$, by themselves or in a mixture with $SiH_4$. Precursors that may be used for formation of SiOF include dimers, such as $Si_2F_6$, by themselves or in a mixture with $SiF_4$. In still another embodiment, the deposition rate for the ILD 110 may be increased by using even higher oligomers, such as trimers or tetramers, for the precursors.

In another embodiment, the deposition rate for the ILD 110 may be increased by using a high Oxygen ($O_2$) component in the plasma. In some cases, atoms with a low ionization potential, such as Argon atoms, may be used to stabilize the plasma. Precursors with a higher molecular weight, such as dimers and higher oligomers, may also be used to stabilize the plasma.

Regardless of the k value of the bulk material used to form the ILD 110, pores 112 may also be created in the ILD 110 to lower the k value of the ILD 110. The k value of the ILD 110 then depends on the k value of the bulk material forming the ILD 110 and the k value of the material filling the pores 112, weighted by the total porosity of the ILD 110.

In one embodiment, the total porosity, or void fraction, of the ILD 110 may be about 0.30 or higher. For comparison, a material without pores has a total porosity of zero. In another embodiment, the total porosity may be about 0.75 or lower. In still another embodiment, the total porosity may be about 0.30–0.75.

The local porosity of the ILD 110 may vary for a given total porosity. In one embodiment, the local porosity may vary depending on the location (x-position and y-position) in the device and on the substrate. In another embodiment, the local porosity may vary depending on the thickness of the ILD 110. In still another embodiment, the local porosity may be graded and vary as a function of z-position within the ILD 110.

The pores 112 may be filled with a gas. The gas may include air with a k value of 1.0. In one embodiment, the ILD 110, with pores 112 filled with air, may have a k value lower than about 3.0. In another embodiment, the ILD 110 formed from porous $SiO_2$ or porous SiOF, filled with air, may have a k value of about 2.5–3.0.

The pores 112 may be created in-situ or ex-situ. In one embodiment, pores 112 are formed in the ILD 110 by using a pore-forming material, or porogen. The porogen may be added in the form of a precursor for the deposition. In another embodiment, pores 112 are formed in the ILD 110 by pulsing the plasma power. In still another embodiment, pores 112 are formed in the ILD 110 by annealing. The anneal may be performed concurrently with the deposition or subsequently to the deposition. The anneal may involve a temperature of about 300–400 degrees Centigrade.

The mechanical strength of the ILD 110 depends on the mechanical strength of the bulk material forming the ILD 110. The mechanical strength of the bulk material depends on the density of the bulk material so it may be desirable to form the ILD 110 from a material with a higher density.

If the ILD 110 is porous, the mechanical strength of the ILD 110 also depends on the total porosity, the pore 112 size, and the pore 112 size distribution. For a particular value of total porosity, an ILD 110 with larger pore 112 sizes may have greater mechanical strength than an ILD 110 with smaller pore 112 sizes.

The ILD 110 should possess good mechanical strength. Young's modulus of elasticity is one measurement of mechanical strength of a material. In a first embodiment, the ILD 110 is porous with a k value of about 3.0 or lower and a Young's modulus of elasticity of about 25 GigaPascals (GPa) or higher. In a second embodiment, the ILD 110 is porous with a k value of about 2.5 or lower and a Young's modulus of elasticity of about 15 GPa or higher. In a third embodiment, the ILD 110 is formed from porous $SiO_2$ or SiOF and has a k value of about 2.5 or lower and a Young's modulus of elasticity of about 15–25 GPa.

Shear strength is another measurement of mechanical strength of a material. The shear strength of the ILD 110 should be sufficient to withstand the CMP process that is used later to planarize the conductor layer 170, as shown in an embodiment in FIG. 1(g). In one embodiment, the ILD 110 is formed from porous $SiO_2$ or SiOF and has a shear strength of about 6–11 GPa.

An embodiment of a variation of a via-first process flow for a dual Damascene scheme will be described next. However, different embodiments of the present invention are compatible with other process flows, such as a variation of a trench-first process flow for a dual Damascene scheme. Other embodiments of the present invention are also compatible with other schemes, such as a single Damascene scheme.

Figure 1B:
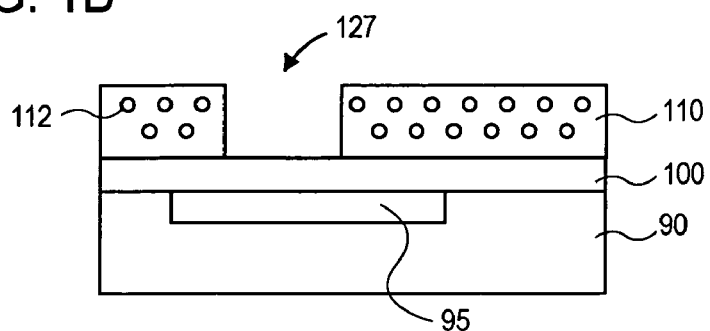
Figure 1C:
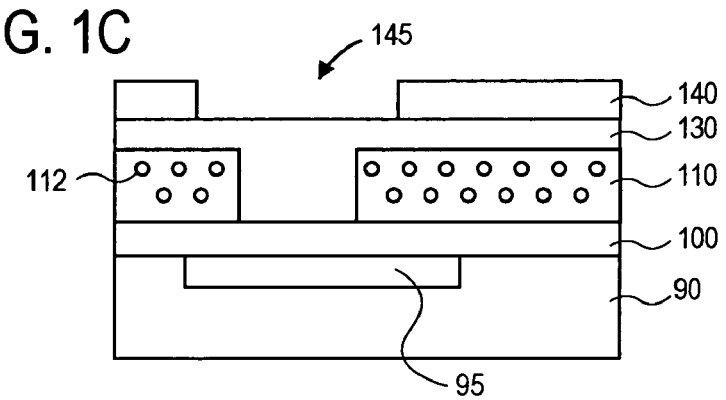

After formation of the ILD 110, the processes of photolithography and etch are used to pattern a via 127, as shown in an embodiment in FIGS. 1(a)–(b). A radiation-sensistive material, such as a via-layer photoresist 120, may be applied over the ILD 110. Then, a portion of the via-layer photoresist 120 is exposed to radiation of the appropriate wavelength and dose. The exposure is performed in an imaging tool, such as a stepper or a scanner. A via-layer reticle may be placed in the path of the radiation to determine the portion of the via-layer photoresist 120 that is to be exposed. Exposure is followed by development of the via-layer photoresist 120 to create a via-layer mask. The via-layer mask includes a via feature 125 that corresponds to the exposed portion of the via-layer photoresist 120, as shown in an embodiment in FIG. 1(a). The shape and critical dimension (CD) of the via feature 125 in the via-layer photoresist 120 is derived from a design on the via-layer reticle.

The via feature 125 patterned in the via-layer photoresist 120 may be transferred into the ILD 110 by a dry etch process, as shown in an embodiment in FIG. 1(b). A dry etch process, such as a plasma etch process or a reactive ion etch process (RIE), may be used to etch a via 127 completely through the ILD 110. Using an etch stop layer 100 under the ILD 110 allows a longer over etch to clean out the bottom of the via 127 without damaging the underlying conductor 95.

High directionality is desired for the via 127 etch when the narrowest portion of the via 127 has a large aspect ratio (depth:width), such as about 6:1 or greater. In one embodiment, a high density plasma, such as a radio frequency (RF) inductively-coupled plasma (ICP), may be used.

The dry etch of the ILD 110 to form the via 127 may be performed with a gas mixture. The gas mixture for etching an ILD 110 formed from an inorganic material may include an etching gas, such as $CF_4$, and a polymerizing gas, such as $CH_2F_2$. The etching gas is the principal source of Fluorine for etching the ILD 110 while the polymerizing gas improves selectivity by passivating the sidewalls of the via 127 during the etch. The etch selectivity of the ILD 110 to the via-layer photoresist 120 may be higher than about 20:1. Other gases that may be used for via 127 etch include $CHF_3$ and $C_3F_6$. The etch rate of the ILD 110 may be selected from a range of about 1,500–12,000 Angstroms per minute.

After via 127 etch, the via-layer photoresist 120 is removed. If desired, the via 127 etch and the strip of the via-layer photoresist 120 may be done sequentially in an integrated tool.

The etch stop layer 100 is thick enough to prevent the via 127 etch from breaking through to damage underlying layers, such as the underlying conductor 95, connected to the device in the substrate.

After formation of the via 127, the processes of photolithography and etch are used to pattern a trench. A bottom anti-reflective coating (BARC) 130 may be formed over the ILD 110 and in the via 127, as shown in an embodiment in FIG. 1(c). Then, a trench-layer photoresist 140, is applied over the BARC 130. The BARC 130 will minimize exposure problems in the vicinity of the via 127, relating to a combination of swing curve effects and light scattering effects caused by the step change in the ILD 110 and the thickness variation in the trench-layer photoresist 140. The BARC 130 also minimizes further etch of the via 127 during the subsequent etch of the trench.

Then, the trench-layer photoresist 140 is exposed using radiation of the appropriate wavelength and dose. The exposure is performed in an imaging tool, such as a stepper or a scanner, and modulated by a trench-layer reticle. Exposure is followed by development of a trench feature 145 in the trench-layer photoresist 140. The trench feature 145 in the trench-layer photoresist 140 is superimposed over the via 127 etched into the ILD 110. The shape and CD of the trench feature 145 is derived from a design on the trench-layer reticle.

Figure 1D:
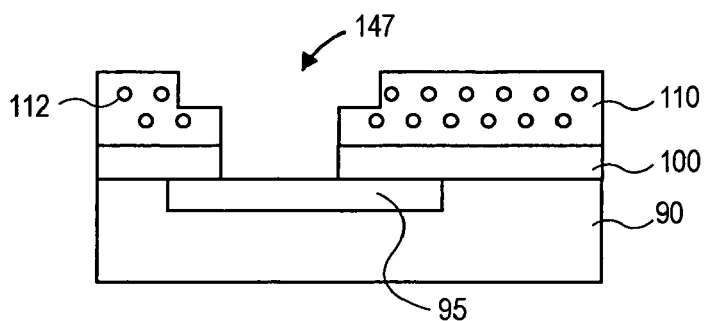

A dry etch process, such as a plasma etch process or an RIE process, may be used to partially etch the ILD 110 to form a trench over the via 127, as shown in an embodiment in FIG. 1(d). High directionality is desired for the trench etch when the narrowest portion of the trench-via opening 147 has a large aspect ratio (depth:width), such as about 6:1 or greater. In one embodiment, a high density plasma, such as an RF ICP, may be used for the trench etch.

The dry etch of the ILD 110 to form the combined trench-via opening 147 may be performed with a gas mixture. The gas mixture for etching an ILD 110 formed from an inorganic material may include an etching gas, such as $CF_4$, and a polymerizing gas, such as $CH_2F_2$. The etching gas is the principal source of Fluorine for etching the ILD 110 while the polymerizing gas improves selectivity by passivating the sidewalls of the trench-via opening 147. The etch selectivity of the ILD 110 to the trench-layer photoresist 140 may be higher than about 20:1. Other gases that may be used for trench etch include $CHF_3$ and $C_3F_6$. The etch rate of the ILD 110 may be selected from a range of about 1,500–12,000 Angstroms per minute.

After etching the trench-via opening 147 in the ILD 110, the trench-layer photoresist 140 and the underlying BARC 130 are removed. If desired, the trench etch and the strip of the trench-layer photoresist 140 and the BARC 130 may be done sequentially in an integrated tool.

Then, the portion of the etch stop layer 100 underlying the trench-via opening 147 is removed, such as by a dry etch, as shown in an embodiment in FIG. 1(d). The underlying conductor 95 should not be damaged by the removal of the portion of the etch stop layer 100 below the trench-via opening 147. Later, the trench-via opening 147 will be filled with a conductor layer 170 to make electrical contact with the device connected to the underlying conductor 95, as shown in an embodiment in FIG. 1(f).

Figure 1E:
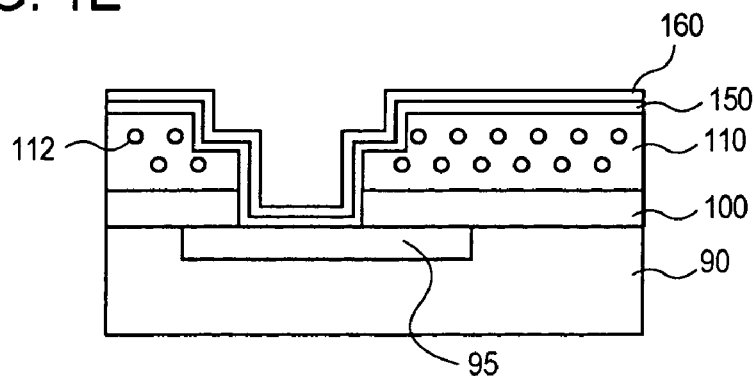
Figure 1F:
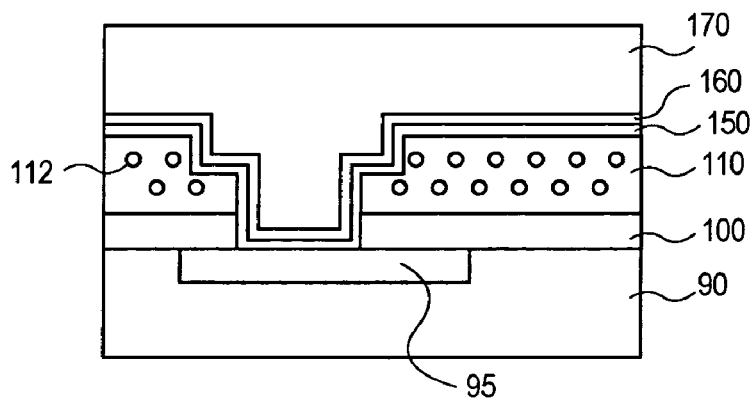
Figure 1G:
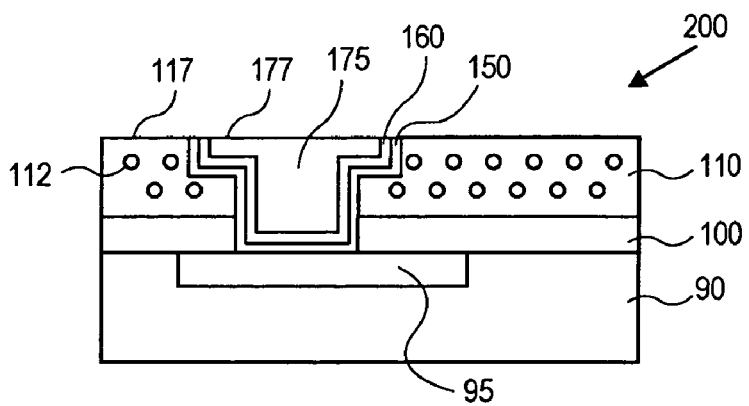

As shown in an embodiment in FIG. 1(e), a barrier layer 150 is formed over the ILD 110 and in the trench-via opening 147. Copper may be used for the conductor layer 170 to be formed later in the trench-via opening 147. Copper has a high diffusivity so the barrier layer 150 must encapsulate the sides and the bottom of the trench-via opening 147 to prevent diffusion of Copper into the ILD 110 and the device connected to the underlying conductor 95. Otherwise, Copper may introduce mid-gap states into the semiconductor material forming the device and degrade carrier lifetime.

The barrier layer 150 may be formed from a metal, including a refractive metal, such as Tantalum (Ta), or an alloy, such as Titanium-Tungsten (TiW), or a ceramic, such as Tantalum-Nitride (TaN), Tantalum-Silicon-Nitride (TaSiN), Titanium-Nitride (TiN), or Tungsten-Nitride (WN). The barrier layer 150 may have a thickness selected from a range of about 80–500 Angstroms.

In one embodiment, the barrier layer 150 may include a lower layer of TaN to adhere to the underlying ILD 110 and an upper layer of Ta to adhere to the overlying seed layer 160. A barrier layer 150 formed from a bilayer may have a total thickness selected from a range of about 150–350 Angstroms.

High directionality is desired for forming the barrier layer 150, especially when the narrowest portion of the trench-via opening 147 has a large aspect ratio (depth:width), such as 6:1 or greater. The technique of ionized physical vapor deposition (I-PVD) may be used to form a material with better step coverage than other techniques, such as collimation sputtering or long-throw sputtering (LTS).

In certain cases, a MOCVD process may be used to form the barrier layer 150. Alternatively, the barrier layer 150 may be formed using atomic layer deposition (ALD), especially for a thickness of about 100 Angstroms or less. ALD may provide good step coverage and good thickness uniformity even while permitting the use of a low deposition temperature of about 200–400 degrees Centigrade.

When the trench-via opening 147 is to be filled later by electroplating a conductor layer 170, a seed layer 160 should first be formed over the barrier layer 150, as shown in an embodiment in FIG. 1(e). In order to serve as a base for electroplating, the seed layer 160 must be electrically conductive and continuous over the barrier layer 150. Adhesion loss of the seed layer 160 from the underlying barrier layer 150 should be prevented. Interfacial reaction of the seed layer 160 with the underlying barrier layer 150 should also be prevented.

The seed layer 160 may be formed from the same or different material as the conductor layer 170 to be formed later. For example, the seed layer 160 may include a metal, such as Copper, or an alloy. The seed layer 160 may have a thickness selected from a range of about 500–2,000 Angstroms.

The seed layer 160 may be deposited by I-PVD, especially when the conductor layer 170 is to be formed later by electroplating. If desired, the barrier layer 150 and the seed layer 160 may be sequentially deposited in a tool, without breaking vacuum, so as to prevent formation of an undesirable interfacial layer between the barrier layer 150 and the seed layer 160.

When the conductor layer 170 is to be subsequently formed by PVD, better material properties and surface characteristics may be achieved for the conductor layer 170 if the seed layer 160 is formed using CVD. The seed layer 160 may also be formed with ALD or electroless plating.

The conductor layer 170, such as a metal, may be formed over the seed layer 160 by an electrochemical process, such as electroplating or electrofilling. The conductor layer 170 may have a thickness that provides an overburden of about 4,000 Angstroms above the ILD 110.

In other embodiments, the conductor layer 170 may be formed with a PVD process or a CVD process. A PVD process or a CVD process may be particularly advantageous when forming the conductor layer 170 over a trench-via opening 147 that has a large aspect ratio (depth:width), such as about 6:1 or greater. A PVD process usually has a lower Cost-of-Ownership (CoO) than a CVD process. In some cases, a MOCVD process may also be used.

The conductor layer 170 may be treated after being formed to modify its material properties or surface characteristics. The treatment may include a rapid thermal anneal (RTA) process after deposition to modify or stabilize grain size. For example, Copper that has been formed by electroplating may have a grain size of about 0.05–10.0 um, depending on the thickness, deposition conditions, and anneal conditions. A larger grain size usually corresponds to a lower resistivity which is more desirable. For example, Copper may have a resistivity of about 1.7–2.5 micro-ohm-centimeter (uohm-cm) at 20 degrees Centigrade.

A chemical-mechanical polishing (CMP) process may be used to remove the overburden of the conductor layer 170 and the portion of the barrier layer 150 over an upper surface 117 of the ILD 110 to create an inlaid interconnect 175 in the trench-via opening 147, as shown in an embodiment in FIG. 1(g). The process of CMP combines abrasion and dissolution to flatten and smoothen surface relief. Abrasion occurs when higher portions of the surface contact a pad and abrasive particles in a slurry and become subject to mechanical forces. Dissolution occurs when materials at the surface contact chemicals in the slurry and become subject to chemical or electrochemical reactions.

The CMP process to create an inlaid interconnect 175 in the trench-via opening 147 may be optimized depending on the polish rates of different materials. Polish selectivity to different materials may be optimized by changing the properties of the polish pad, the properties of the polish slurry, and the parameters of the polish tool.

In one embodiment, the slurry may include an abrasive and a complexing agent. The abrasive may include particles, such as Alumina ($Al_2O_3$) or Silica ($SiO_2$), while the complexing agent may include a chemical, such as Ammonium Hydroxide ($NH_4OH$) or Potassium Hydroxide (KOH). A relatively soft pad may be used to prevent the generation of defects. A final buff may be used to remove scratches.

In a first embodiment, the CMP process involves three polishes. The first polish removes most of the overburden of the conductor layer 170. The second polish planarizes the remaining conductor layer 170 over the barrier layer 150. The polish rate of the conductor layer 170 in the first polish and the second polish may be selected from a range of about 900–13,000 Angstroms per minute. The third polish removes the portion of the barrier layer 150 over the upper surface 117 of the ILD 110.

In a second embodiment, the CMP process involves two polishes. The first polish removes all of the overburden of the conductor layer 170 and planarizes the conductor layer 170 over the barrier layer 150. The second polish removes the portion of the barrier layer 150 over the upper surface 117 of the ILD 110.

In a third embodiment, the CMP process involves one polish to remove all of the overburden of the conductor layer 170 and remove the portion of the barrier layer 150 over the upper surface 117 of the ILD 110.

The CMP process should not cause the ILD 110 to fracture or delaminate due to excessive stress. After the CMP process, an upper surface 177 of the inlaid interconnect 175 should be approximately flat and level with the upper surface 117 of the ILD 110.

After planarization with CMP, an etch stop layer may be formed over the upper surface 177 of the inlaid interconnect 175 and the upper surface 117 of the ILD 110. In some cases, the etch stop layer may also serve as a capping layer to prevent diffusion, intermixing, or reaction of the inlaid interconnect 175 with the surrounding materials.

A process sequence similar to the embodiment shown in FIGS. 1(a)–(g) may be repeated to form the next higher layer of inlaid interconnect. In a dual Damascene scheme, each layer includes a via and an overlying trench. The total number of layers may depend on the device design rules. In one embodiment, a total of 7–10 layers may be formed.

The present invention also discloses a structure 200 including a dielectric, such as an ILD 110, having a low dielectric constant and good mechanical strength; an opening located in the ILD 110; and an inlaid interconnect 175 located in the opening. An embodiment is shown in FIG. 1(g). The opening may include a via with an overlying trench. The inlaid interconnect 175 may include a metal, such as Copper, or an alloy.

In one embodiment, the dielectric constant, or k value, of the ILD 110 in the structure 200 may be about 3.0 or lower and the mechanical strength may include a Young's modulus of elasticity of about 25 GigaPascals or higher. In another embodiment, the k value of the ILD 110 may be about 2.5 or lower and the Young's modulus of elasticity may be about 15 GPa or higher.

The ILD 110 may include $SiO_2$ or SiOF. The ILD 110 may include pores 112. The total porosity, or void fraction, may be about 0.30–0.75. In one embodiment, the k value of the ILD 110, formed from porous $SiO_2$ or SiOF, may be about 2.5 or lower and the Young's modulus of elasticity may be about 15–25 GPa while the shear strength may be about 6–11 GPa.

Many embodiments and numerous details have been set forth above in order to provide a thorough understanding of the present invention. One skilled in the art will appreciate that many of the features in one embodiment are equally applicable to other embodiments. One skilled in the art will also appreciate the ability to make various equivalent substitutions for those specific materials, processes, dimensions, concentrations, etc. described herein. It is to be understood that the detailed description of the present invention should be taken as illustrative and not limiting, wherein the scope of the present invention should be determined by the claims that follow.

Thus, we have described a method of forming an electrically insulating material with a low dielectric constant and good mechanical strength and a structure including a dielectric having a low dielectric constant and good mechanical strength.

We claim:

1. A method comprising:
   providing a substrate;
   forming a dielectric over said substrate with chemical vapor deposition using $S_2F_6$ precursors, said dielectric having a k value of about 2.5 or lower, said dielectric having a Young's modulus of elasticity of about 15 GigaPascals or higher;
   forming an opening in said dielectric; and
   forming a conductor in said opening.

2. The method of claim 1 wherein said dielectric is formed with chemical vapor deposition with a higher deposition rate.

3. The method of claim 1 wherein said dielectric is formed with plasma-enhanced chemical vapor deposition (PECVD) with low power, high pressure, and high gas flowrate.

4. The method of claim 1 wherein said dielectric comprises pores.

5. The method of claim 1 wherein said dielectric comprises pores formed by using a porogen.

6. The method of claim 1 wherein said dielectric comprises pores formed by pulsing the plasma power.

7. The method of claim 1 wherein said dielectric comprises pores formed by annealing.

8. The method of claim 1 wherein said dielectric comprises pores formed by annealing at a temperature of about 300–400 degrees Centigrade.

9. A method comprising:
   providing a substrate;
   forming an interlayer dielectric (ILD) over said substrate with chemical vapor deposition using $S_2F_6$ precursors, said ILD having a k value of 2.5 or lower, said ILD having a Young's modulus of elasticity of 15 GigaPascals or higher;
   forming a via and an overlying trench in said ILD; and
   forming an inlaid interconnect in said via and said overlying trench.

10. The method of claim 9 wherein said ILD is formed with plasma-enhanced chemical vapor deposition (PECVD) with low power, high pressure, and high gas flowrate.

11. The method of claim 9 wherein said ILD comprises pores with a total porosity, or void fraction, of about 0.30–0.75.

* * * * *